(12) United States Patent
Kim (10) Patent No.: US 9,536,807 B2
(45) Date of Patent: Jan. 3, 2017

(54) STACK PACKAGE AND SEMICONDUCTOR INTEGRATED CIRCUIT DEVICE INCLUDING A VARIABLE VOLTAGE

(71) Applicant: SK hynix Inc., Icheon-si Gyeonggi-do (KR)

(72) Inventor: Kyung Whan Kim, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 41 days.

(21) Appl. No.: 14/731,649

(22) Filed: Jun. 5, 2015

(65) Prior Publication Data
US 2016/0254213 A1 Sep. 1, 2016

(30) Foreign Application Priority Data
Feb. 27, 2015 (KR) ................ 10-2015-0028339

(51) Int. Cl.
*H03L 5/00* (2006.01)
*H01L 23/48* (2006.01)
*H03K 3/356* (2006.01)
*H01L 25/18* (2006.01)

(52) U.S. Cl.
CPC ............. *H01L 23/481* (2013.01); *H01L 25/18* (2013.01); *H01L 2224/13025* (2013.01); *H01L 2224/16146* (2013.01); *H01L 2224/16227* (2013.01); *H01L 2224/17181* (2013.01); *H01L 2225/06513* (2013.01); *H01L 2225/06517* (2013.01); *H01L 2225/06541* (2013.01); *H01L 2225/06565* (2013.01); *H01L 2924/14* (2013.01); *H01L 2924/1434* (2013.01); *H03K 3/356113* (2013.01)

(58) Field of Classification Search
None
See application file for complete search history.

(56) References Cited

U.S. PATENT DOCUMENTS

| | | | | |
|---|---|---|---|---|
| 7,521,976 | B1* | 4/2009 | Sudjian | H03K 3/012 327/199 |
| 9,338,036 | B2* | 5/2016 | Poulton | H04L 25/0272 |
| 9,377,846 | B2* | 6/2016 | Cheong | G06F 1/3256 |
| 2006/0132192 | A1* | 6/2006 | Yu | H03K 5/2481 327/65 |
| 2009/0140778 | A1* | 6/2009 | Kikuchi | H03F 3/45197 327/108 |
| 2012/0129301 | A1* | 5/2012 | Or-Bach | G11C 8/16 438/129 |

(Continued)

FOREIGN PATENT DOCUMENTS

KR 1020110138099 A 12/2011

*Primary Examiner* — Lincoln Donovan
*Assistant Examiner* — Khareem E Almo
(74) *Attorney, Agent, or Firm* — William Park & Associates Ltd.

(57) ABSTRACT

A stack package may include a first chip, a second chip, a through silicon via (TSV) and an interface circuit unit. The first chip may include a first internal circuit unit driven by an internal voltage. The second chip may be stacked over the first chip. The second chip may include a second internal circuit unit driven by the internal voltage. The TSV may be electrically coupled between the first chip and the second chip. The interface circuit unit may be arranged in the first chip and the second chip. The interface circuit unit may be coupled to the TSV. A portion of the interface circuit unit may be received a variable voltage different from the internal voltage as a driving voltage.

21 Claims, 6 Drawing Sheets

(56) References Cited

U.S. PATENT DOCUMENTS

2012/0176189 A1* 7/2012 Chen .................. H03K 19/0016
                                                              327/543
2016/0094226 A1* 3/2016 Wang ............. H03K 19/017509
                                                              307/130
2016/0254213 A1* 9/2016 Kim ................. H03K 3/356113

* cited by examiner

STACK PACKAGE AND SEMICONDUCTOR INTEGRATED CIRCUIT DEVICE INCLUDING A VARIABLE VOLTAGE

CROSS-REFERENCES TO RELATED APPLICATION

The present application claims priority under 35 U.S.C. §119(a) to Korean application number 10-2015-0028339, filed on Feb. 27, 2015, in the Korean Intellectual Property Office, which is incorporated herein by reference in its entirety.

BACKGROUND

1. Technical Field

Various embodiments generally relate to a stack package, and more particularly, to a stack package and semiconductor integrated circuit device including a variable voltage.

2. Related Art

In order to increase the degree of integration in a memory chip, a two-dimensional (2D) structure including a plurality of the memory chips may be arranged on a single plane. The memory chip may be converted into a three-dimensional (3D) structure. In a 3D structure the memory chips may be stacked. Memory chips having high degrees of integration and high capacity may be required. To satisfy this requirement the 3D structure of the memory chips may be used to increase the capacity and reduce a size of a semiconductor chip. Thus, improving the integration degree of the memory chip.

The 3D structure may implement a through silicon via (TSV) technique. The TSV technique may be used for improving low transmission speeds. Low transmission speeds may be caused by a distance of a controller on a module, by variables on a package, and a weak data bandwidth.

In the TSV technique, a hole may be formed through the memory chips. An electrode may be formed in the hole. Communication between the memory chips may be performed through the electrodes.

SUMMARY

According to an embodiment, there may be provided a stack package. The stack package may include a first chip, a second chip, an interconnecting unit and an interface circuit unit. The first chip may include a first internal circuit unit driven by an internal voltage. The second chip may be stacked over the first chip. The second chip may include a second internal circuit unit driven by the internal voltage. The interconnecting unit is electrically coupled between the first chip and the second chip. The interface circuit unit may be arranged in the first chip and the second chip. The interface circuit unit may be coupled to the through silicon via (TSV). A portion of the interface circuit unit may receive a variable voltage different from the internal voltage as a driving voltage.

According to an embodiment, there may be provided a semiconductor integrated circuit device. The semiconductor integrated circuit device may include a first internal circuit unit, a transmitter, a receiver and a second internal circuit unit. The transmitter may be electrically coupled with the first internal circuit unit. The receiver may be electrically coupled with the transmitter. The second internal circuit unit may be electrically coupled with the receiver. The first internal circuit unit, the receiver and the second internal circuit unit may receive a peripheral voltage as a driving voltage. The transmitter may receive a variable voltage of no less than or no more than the peripheral voltage as the driving voltage.

DETAILED DESCRIPTION

Various examples of embodiments will be described more fully hereinafter with reference to the accompanying drawings, in which some examples are illustrated. The embodiments, however, be embodied in many different forms and should not be construed as limited to the various examples of embodiments set forth herein.

Rather, these examples of embodiments are provided so that this disclosure will be thorough and complete, and will fully convey the scope of the application to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the application.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples of embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Examples of embodiments are described herein with reference to cross-sectional illustrations that are schematic illustrations of idealized examples of embodiments (and intermediate structures). As such, variations from the shapes of the illustrations as a result, for example, of manufacturing techniques and/or tolerances, are to be expected. Thus, the examples of the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the application.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of the embodiments will be explained with reference to the accompanying drawings.

According to various examples of embodiments, a power of the transmitting unit in the interface circuit unit of the TSV may be driven by the variable voltage so that errors caused by a chip level or the TSV and the interface circuit unit may be accurately predicted.

Figure 1:
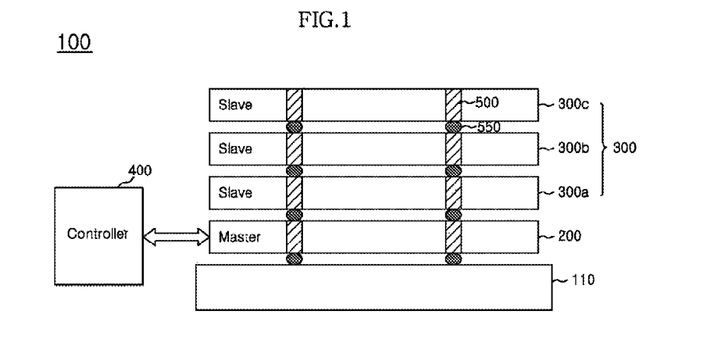
FIG. 1 is a cross-sectional view illustrating a representation of an example of a stack package in accordance with an embodiment.

FIG. 1 is a cross-sectional view illustrating a representation of an example a stack package in accordance with an embodiment.

Referring to FIG. 1, a stack package 100 may include a package substrate 110, a master chip 200 and a plurality of slave chips 300 (300a, 300b and 300c).

The master chip 200 may be mounted on the package substrate 110, i.e., a printed circuit board (PCB). The package substrate 110 may include an input/output circuit (not illustrated) configured to interface with the outside of the stack package 100, and a memory core (not illustrated). The master chip 200 may be configured to interface control commands and data with a controller 400.

The slave chips 300a, 300b and 300c may be sequentially stacked on the master chip 200. Each of the slave chips 300a, 300b and 300c may include a memory core (not illustrated).

In various examples of embodiments, the master chip 200 and the slave chips 300a, 300b and 300c may include substantially the same chip. In various examples of embodiments, the master chip 200 and the slave chips 300a, 300b and 300c may include different chips from each other.

The mater chip 200 and the slave chips 300a, 300b and 300c may be electrically connected with each other via an interconnecting unit. The interconnecting unit may include TSVs 500. The interconnecting unit may include connecting terminals 550. The interconnecting unit may include TSVs 500 and connecting terminals 550. Thus, the control commands and the data may be transmitted between the master chip 200 and the slave chips 300a, 300b and 300c. The connecting terminals 550 may include a conductive bump. The TSVs 500 may be formed through the master chip 200 and the slave chips 300a, 300b and 300c. The connecting terminals 550 may be interposed between the TSVs 500.

Figure 2:
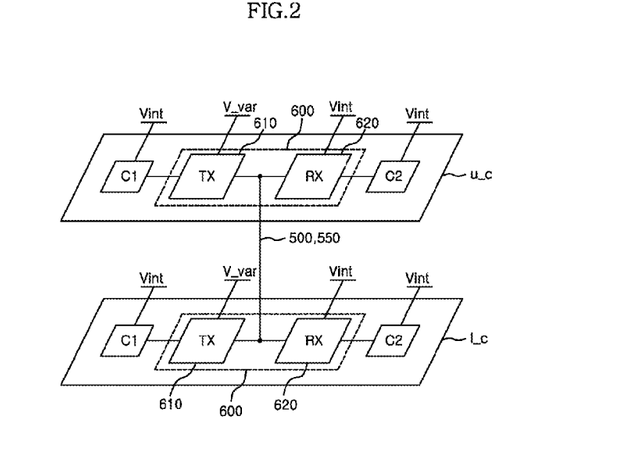
FIG. 2 is a perspective view illustrating a representation of an example of two chips selected from a master chip and slave chips sequentially stacked.

FIG. 2 is a perspective view illustrating a representation of an example of two chips selected from a master chip and slave chips sequentially stacked. For convenience of explanation, a chip, which may be positioned at a low region in FIG. 2, may be referred to as a lower chip l_c. For convenience of explanation, a chip, which may be positioned at an upper region in FIG. 2, may be referred to as an upper chip u_c. The lower chip l_c may correspond to the master chip 200 or the slave chip 300a. The upper chip u_c may correspond to any one of the slave chips 300a, 300b and 300c.

Referring to FIG. 2, each lower chip l_c and upper chip u_c stacked by the TSVs 500 may include internal circuit units C1 and C2, and an interface circuit unit 600.

The internal circuit units C1 and C2 may be electrically connected with the interface circuit unit 600 to receive the control commands transmitted to the master chip 200 through the interface circuit unit 600. Data in the internal circuit units C1 and C2 may be transmitted to the master chip 200 through the interface circuit unit 600.

For example, when the corresponding chip may include the master chip 200, the internal circuit units C1 and C2 may include a control circuit and a memory circuit, respectively. In contrast, when the corresponding chip may include any one of the slave chips 300a, 300b and 300c, the internal circuit units C1 and C2 may include a memory circuit.

The internal circuit units C1 and C2 may be driven by an internal voltage Vint. The internal voltage Vint may be generated using an external voltage VDD. For example, the internal voltage Vint may include a peripheral voltage Vperi.

Figure 3:
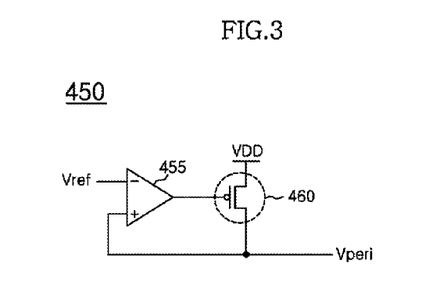
FIG. 3 is a circuit diagram illustrating a representation of an example of a peripheral voltage generator in accordance with various examples of embodiments.

FIG. 3 is a circuit diagram illustrating a representation of an example of a peripheral voltage generator in accordance with various examples of embodiments.

Referring to FIG. 3, a peripheral voltage-generating circuit 450 may include a comparing unit 455 and a transistor, for example a PMOS transistor 460.

The comparing unit 455 may be configured to receive a reference voltage Vref as an input signal. The comparing unit 455 may be configured to receive an output voltage of the PMOS transistor 460 as an input signal.

The PMOS transistor 460 may include a gate, a source, and a drain. An output signal of the comparing unit 455 may be inputted into the gate of the PMOS transistor 460. The external voltage VDD may be inputted into the source of the PMOS transistor 460. The peripheral voltage Vperi may be generated in the drain of the PMOS transistor 460.

Figure 4:
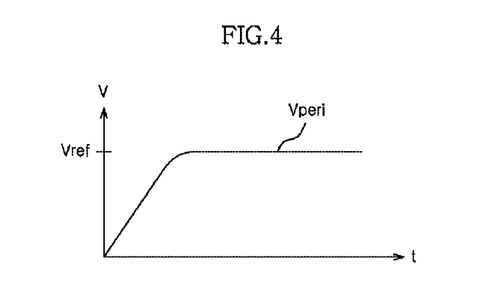
FIG. 4 is a graph illustrating a representation of an example of peripheral voltage characteristics in accordance with an embodiment.

Referring to FIG. 4, the horizontal access is in units of time t and the vertical access is in volts v. The peripheral voltage Vperi may be increased proportional to the external voltage VDD to the reference voltage Vref. The peripheral voltage Vperi may be saturated at the reference voltage Vref to have a flat level.

In various examples of embodiments, the external voltage VDD may be inputted into the source of the PMOS transistor 460 as a driving voltage. Alternatively, various levels of voltages, for example, VPP, VPPE or various levels of external voltages VDD1 and VDD2, etc., may be inputted into the source of the PMOS transistor 460 to generate various internal voltages Vint as the driving voltage.

In various examples of embodiments, the internal voltage may include the peripheral voltage Vperi. Alternatively, it may be obvious to one skilled in the art that various internal voltages may be generated by changing levels of an external voltage.

Referring to FIG. 2, the interface circuit unit 600 may include a transmitter (TX) 610 and a receiver (RX) 620.

The transmitter (TX) 610 may be driven by a variable voltage V_var. The receiver (RX) 620 may be driven by the internal voltage Vint. The internal voltage may include the peripheral voltage Vperi. The internal circuit units C1 and C2 may be driven by the internal voltage Vint. The internal voltage may include the peripheral voltage Vperi.

Figure 5:
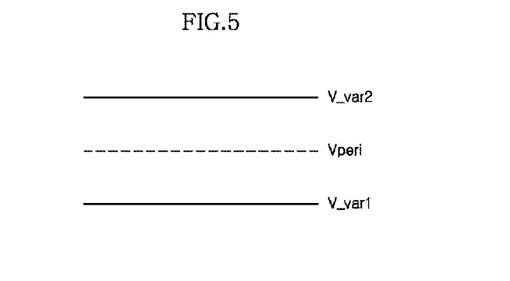
FIG. 5 is view illustrating a representation of an example of variable voltage levels in accordance with various examples of the embodiments.

FIG. 5 is view illustrating a representation of an example of variable voltage levels in accordance with various examples of the embodiments.

Referring to FIG. 5, the variable voltage V_var may be set as a first variable voltage V_var1 of no more than the peripheral voltage Vperi or a second variable voltage V_var2 of no less than the peripheral voltage Vperi.

For example, when a process for testing a chip and an interface may be performed under a condition that the first variable voltage V_var1 may be set as a driving voltage of the transmitter (TX) 610, operational characteristics of designed circuits in each of the chips may be tested under exclusion of operational characteristics of the interface circuit unit 600, because the operational characteristics of the interface circuit unit 600 is decreased. Thus, an operational margin between the chips may be identified.

When, for example, a process for testing a chip and an interface may be performed under a condition that the second variable voltage V_var2 may be set as a driving voltage of the transmitter (TX) 610, the operational characteristics and delay characteristics of the interface circuit unit 600 may be theoretically improved by increasing of the driving voltage. However, when, for example, the operational characteristics and the delay characteristics of the interface circuit unit 600 may not be improved in spite of the increasing of the driving voltage, an error of the interface circuit unit 600 may be identified.

During the test process, the error caused by the chip or the TSV 500 may be identified by varying the driving voltage of the transmitter (TX) 610.

Figure 6:
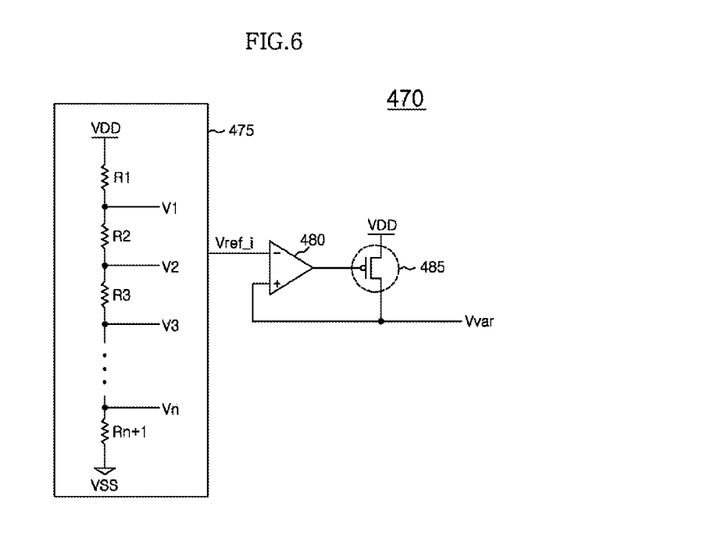
FIG. 6 is a circuit diagram illustrating a representation of an example of a variable voltage generator in accordance with an embodiment.

FIG. 6 is a circuit diagram illustrating a representation of an example of a variable voltage generator in accordance with an embodiment.

Referring to FIG. 6, a variable voltage generator 470 may include a voltage dividing unit 475, a comparing unit 480 and a transistor, for example a PMOS transistor 485.

The voltage dividing unit 475 may include a plurality of resistors R1–Rn+1 connected to the external voltage source VDD in series. A plurality of voltages V1-Vn may be generated from connection nodes between the resistors. The voltages V1-Vn may have different levels from each other.

The comparing unit 480 may receive an output voltage of the voltage dividing unit 475 as a reference voltage Vref_i. The comparing unit 480 may receive an output voltage (i.e., variable voltage V_var) of the PMOS transistor 485. The comparing unit 480 may compare the output voltage of the voltage dividing unit 475 with the output voltage (i.e., variable voltage V_var) of the PMOS transistor 485.

The PMOS transistor 485 may include a gate, a source, and a drain. The gate of the PMOS transistor 485 may receive an output signal of the comparing unit 480. The source of the PMOS transistor 485 is connected to a terminal of the external voltage VDD. The variable voltage V_var is generated in the drain of the PMOS transistor 485.

For example, the variable voltage V_var may be determined in accordance with levels of the output voltage from the voltage dividing unit 475.

In various examples of embodiments, the external voltage VDD may be inputted into the source of the PMOS transistor 485. Alternatively, various levels of voltages, for example, VPP, VPPE or various levels of external voltages VDD1 and VDD2, etc., may be inputted into the source of the PMOS transistor 485 to generate various variable voltages V_var.

Figure 7:
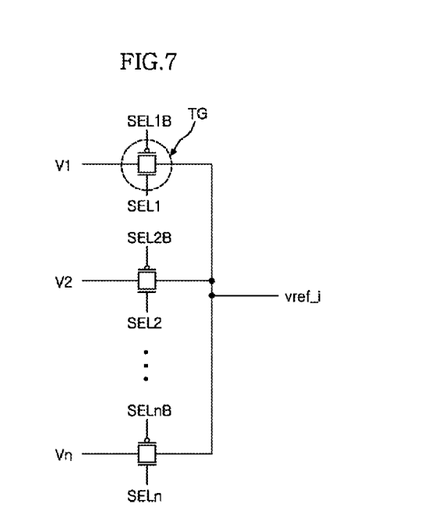
FIG. 7 is a circuit diagram illustrating a representation of an example of a reference voltage-fixing circuit unit in accordance with an embodiment.

When, for example, the variable voltage V_var is fixed to a specific level in a test mode, as illustrated in FIG. 7, a transfer gate TG driven by fuse-selecting signals SEL1/SEL1B-SELn/SELnB may be connected to each of the voltage output nodes of the voltage dividing unit 475. The corresponding transfer gate TG may be turned-on by driving a selected any one of the fuse-selecting signals SEL1/SEL1B-SELn/SELnB, for example, fuse-cutting to fix a specific dividing voltage as a reference voltage Vref_i.

Figure 8:
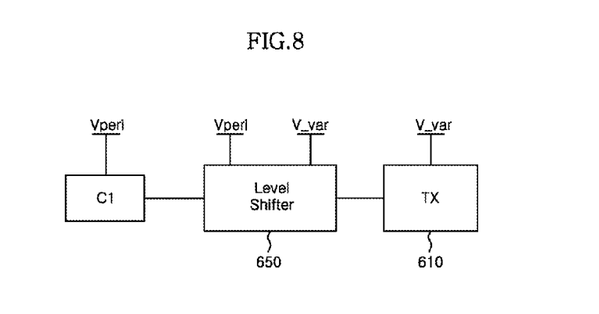
FIG. 8 is a block diagram illustrating a representation of an example of a semiconductor integrated circuit device in accordance with an embodiment.

Referring to FIG. 8, a level shifter 650 may be connected between the internal circuit unit C1 and the transmitter (TX) 610.

For example, the variable voltage V_var may be higher or lower than the peripheral voltage Vperi.

For example, the transmitter (TX) 610 may be driven by the variable voltage V_var. In an embodiment, the internal circuit unit C1 connected to the transmitter (TX) 610 may be driven by the peripheral voltage Vperi related to the variable voltage V_var. A leakage current caused by a difference between the variable voltage V_var and the peripheral voltage Vperi may be generated.

In order to prevent the leakage current, the level shifter 650 connected between the internal circuit unit C1 and the transmitter (TX) 610 may shift the peripheral voltage Vperi to the variable voltage V_var.

Figure 9:
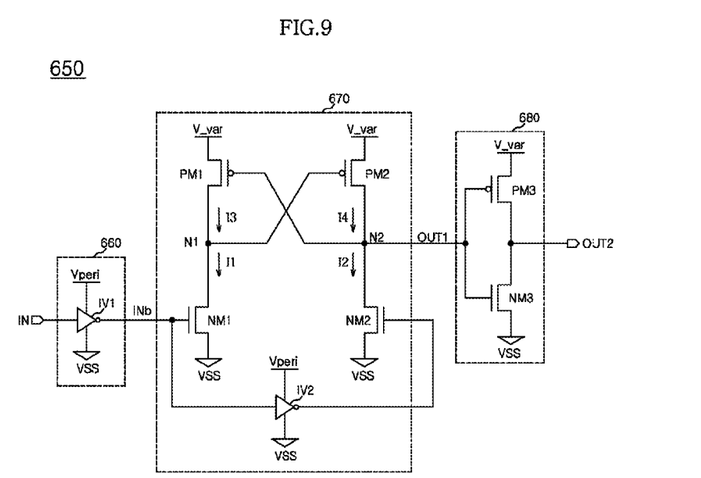
FIG. 9 is a circuit diagram illustrating a representation of an example of a level shifter in accordance with an embodiment.

Referring to FIG. 9, the level shifter 650 may include a first logic circuit unit 660, a shifting circuit unit 670, and a second logic circuit unit 680.

The first logic circuit unit 660 may include an inverter IV1. The inverter IV1 may be configured to use the peripheral voltage Vperi as a driving voltage or a power voltage. The inverter IV1 may invert an input signal IN to output an input signal INb inputted to the shifting circuit unit 670.

The shifting circuit unit 670 may include first and second PMOS transistors PM1 and PM2, first and second NMOS transistors NM1 and NM2, and an inverter IV2. The first and second PMOS transistors PM1 and PM2 may include gates and sources, respectively. The gates of the first and second PMOS transistors PM1 and PM2 may be cross connected to the drains of the first and second PMOS transistors PM1 and PM2. The first and second NMOS transistors NM1 and NM2 may include gates and sources, respectively. The gates of the first and second PMOS transistors PM1 and PM2 may be cross connected to the drains of the first and second NMOS transistors NM1 and NM2. The inverter IV2 may use the peripheral voltage Vperi and a ground voltage VSS as a driving voltage.

The shifting circuit unit 670 may apply the variable voltage V_var to sources of the first and second PMOS transistors PM1 and PM2. The shifting circuit unit 670 may apply the ground voltage VSS to sources of the first and second NMOS transistors NM1 and NM2. The inverter IV2 may be connected between the gate of the first NMOS transistor NM1 and the second NMOS transistor NM2. The shifting circuit unit 670 may convert the input signal INb having, for example, the level of the peripheral voltage Vperi into an output signal OUT1 having the level of the variable voltage V_var.

The second logic circuit unit 680 may include an inverter, the inverter may include a third PMOS transistor PM3 and a third NMOS transistor NM3. The variable voltage V_var may be applied to a source of the third PMOS transistor PM3. The ground voltage VSS may be applied to a source of the third NMOS transistor NM3. The second logic circuit unit 680 may output the variable voltage V_var and the ground voltage VSS as output signals OUT2.

For example, when the input signal INb is shifted from a low level to a high level, the first NMOS transistor NM1 may be turned-on and the second NMOS transistor NM2 may be turned-off. A pull-down current I1 may flow through the first NMOS transistor NM1 so that a voltage of a first node N1 may be decreased to the ground voltage VSS. A second node N2 to which the ground voltage VSS may be applied to may turn-on the first PMOS transistor PM1 so that a pull-up current I3 may be supplied to the first node N1 through the first PMOS transistor PM1. A voltage level may be determined by the pull-up current I3 of the first node N1 and the pull-down current I1. When, for example, the voltage level of the first node N1 is lowered, the second PMOS transistor PM2 may be turned-on so that the voltage level of the second node N2 may approach the variable voltage V_var level. A voltage-driving capacity of the first PMOS transistor PM1 may be reduced and the pull-up current I3 may also be decreased so that the voltage level of the first node N1 may be converted into the ground voltage VSS. When, for example, the first node N1 is fully converted into the level of the ground voltage VSS, the voltage level of the second node N2 may be shifted to the variable voltage V_var. A level shifter circuit may output the output signal OUT1 having a high level. The second logic circuit unit 680 may receive the output signal OUT1 having the high level and then output the output signal OUT2 having the low level.

For example, when the voltage of the second node N2 is lower than the variable voltage V_var, the third PMOS transistor PM3 of the second logic circuit unit 680 may not be fully turned-off so that the leakage current may flow.

When, for example, the input signal INb is shifted from a high level to a low level, the first NMOS transistor NM1 may be turned-off and the second NMOS transistor NM2 may be turned-on. A second pull-down current I2 may flow through the second NMOS transistor NM2 so that the voltage level of the second node N2 may be decreased. Because a pull-up current I4 may be supplied to the second node N2 through the second PMOS transistor PM2, which may be turned-on by the voltage of the first node N1 before the input signal INb may be shifted to the low level, the voltage level of the second node N2 may be decreased to the ground voltage VSS. The voltage of the second node N2 may turn-on the first PMOS transistor PM1. Because the pull-up current I3 may be supplied to the first node N1 through the first PMOS transistor PM1, the voltage level of the first node N1 may be increased to the variable voltage V_var.

The second PMOS transistor PM2 to which the voltage level of the first node N1 is applied may be turned-off so that the pull-up current I4 may not be supplied to the second node N2. The shifting circuit unit 670 may output the output signal OUT1 having the low level. The second logic circuit unit 680 may receive the output signal OUT1 having the low level. The second logic circuit unit 680 may then output the output signal OUT2 having the high level.

Although a difference between the driving voltages of the internal circuit units may be generated, the leakage current may be suppressed by the level shifter 650.

In an embodiment, the level shifter 650 may include other circuits configured to vary voltage levels as well as the structure illustrated in FIG. 9.

Figure 10:
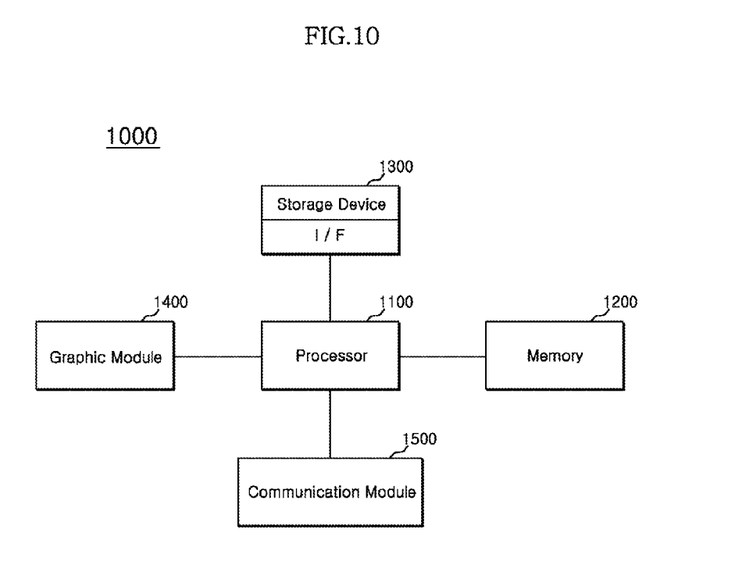
FIG. 10 is a block diagram illustrating a representation of an example of a mobile system in accordance with various examples of the embodiments.

FIG. 10 is a block diagram illustrating a representation of an example of a mobile system in accordance with various examples of the embodiments (i.e., the embodiments associated with FIGS. 1-9).

Referring to FIG. 10, a mobile device 1000 may include at least one processor 1100, at least one memory 1200, and at least one storage device 1300. The mobile device 1000 may include a graphic module 1400, and a communication module 1500. The at least one memory 1200 may include a memory module according to various examples of the embodiments described above with relation to FIGS. 1-9. The storage device 1300 may be connected with the processor 1100 through a PCIe interface or a SATAe interface. An interface of the storage device 1300 may not be limited to the PCIe interface or the SATAe interface. For example, the storage device 1300 may use one of various interfaces (e.g., SATA, SAS, UFS, eMMC, infiniband, RC, etc.).

While various embodiments have been described above, it will be understood to those skilled in the art that the embodiments described are by way of example only. Accordingly, the circuit and method described herein should not be limited based on the described embodiments.

What is claimed is:

1. A stack package comprising:
   a first chip including a first internal circuit unit driven by an internal voltage;
   a second chip including a second internal circuit unit driven by the internal voltage, the second chip stacked over the first chip;
   an interconnecting unit electrically coupled between the first chip and the second chip; and
   an interface circuit unit arranged in the first chip and the second chip, the interface circuit unit coupled to the interconnecting unit, wherein a portion of the interface circuit unit is configured to receive a variable voltage different from the internal voltage as a driving voltage.

2. The stack package of claim 1, wherein the interface circuit unit comprises:
a transmitter; and
a receiver coupled to the transmitter and the interconnecting unit.

3. The stack package of claim 2, wherein the transmitter is configured to receive the variable voltage as the driving voltage, and the receiver is configured to receive the internal voltage as the driving voltage.

4. The stack package of claim 2, wherein the internal voltage comprises a peripheral voltage.

5. The stack package of claim 4, wherein the peripheral voltage is generated by a peripheral voltage generating circuit, the peripheral voltage generating circuit comprising:
a comparing unit configured to receive a reference voltage; and
a PMOS transistor connected to the external voltage, the PMOS transistor configured to be selectively turned-on by an output signal of the comparing unit,
wherein a voltage at a drain of the PMOS transistor is the peripheral voltage and the peripheral voltage is feedback to an input terminal of the comparing unit.

6. The stack package of claim 2, further comprising:
a level shifter electrically coupled between the first internal circuit unit and the transmitter of the interface circuit unit arranged in the first chip or between the second internal circuit unit and the transmitter, the level shifter configured to receive the internal voltage and to output the variable voltage.

7. The stack package of claim 1, further comprising a variable voltage generator configured to generate the variable voltage.

8. The stack package of claim 7, wherein the variable voltage generator comprises:
a voltage dividing unit configured to receive an external voltage and to generate a plurality of dividing voltages;
a comparing unit configured to receive any one of the dividing voltages as a reference voltage; and
a PMOS transistor connected to the external voltage, the PMOS transistor configured to be selectively turned-on by an output signal of the comparing unit,
wherein a voltage at a drain of the PMOS transistor is the variable voltage and the variable voltage is feedback to an input terminal of the comparing unit.

9. The stack package of claim 8, wherein a transfer gate driven by a fuse-selecting signal is connected to each of output terminals of the voltage dividing unit from which the dividing voltages are outputted, and any one of the dividing voltages is fixed to the reference voltage by the fuse-selecting signal.

10. The stack package of claim 1, wherein the first chip comprises a master chip, and the second chip comprises a slave chip.

11. The stack package of claim 10, further comprising:
a controller coupled to the master chip and configured to send and receive an interface control command and data to the master chip; and
a package substrate, the master chip mounted on the package substrate.

12. The stack package of claim 10,
wherein the first internal circuit unit includes a control circuit, and
wherein the second internal circuit unit includes a memory circuit.

13. The stack package of claim 1, wherein the first chip and the second chip comprise a slave chip.

14. The stack package of claim 13, wherein the first and the second internal circuit units include a memory circuit.

15. The stack package of claim 1, wherein the interconnecting unit comprises:
through silicon vias (TSVs) formed in the first and second chips; and
a connecting terminal electrically coupled between the TSVs.

16. A semiconductor integrated circuit device comprising:
a first internal circuit unit;
a transmitter coupled to the first internal circuit unit;
a receiver coupled to the transmitter; and
a second internal circuit unit coupled to the receiver,
wherein the first internal circuit unit, the receiver and the second internal circuit unit are configured to receive an internal voltage as a driving voltage, and the transmitter is configured to receive a variable voltage greater or less than the internal voltage as the driving voltage.

17. The semiconductor integrated circuit device of claim 16, further comprising a level shifter coupled between the first internal circuit unit and the transmitter, the level shifter configured to receive a peripheral voltage and to output the variable voltage.

18. The semiconductor integrated circuit device of claim 16, further comprising a variable voltage generator configured to generate the variable voltage.

19. The semiconductor integrated circuit device of claim 18, wherein the variable voltage generator comprises:
a voltage dividing unit configured to receive an external voltage and to generate a plurality of dividing voltages;
a comparing unit configured to receive any one of the dividing voltages as a reference voltage; and
a PMOS transistor connected to the external voltage, the PMOS transistor configured to be selectively turned-on by an output signal of the comparing unit,
wherein a voltage at a drain of the PMOS transistor is the variable voltage and the variable voltage is feedback to an input terminal of the comparing unit.

20. The semiconductor integrated circuit device of claim 19, wherein a transfer gate driven by a fuse-selecting signal is connected to each of output terminals of the voltage dividing unit from which the dividing voltages are outputted, and any one of the dividing voltages is fixed to the reference voltage by the fuse-selecting signal.

21. The semiconductor integrated circuit device of claim 16, further comprising a through silicon via (TSV) connected between connection nodes of the transmitter and the receiver, the TSV electrically coupled with a lower semiconductor chip.

* * * * *